United States Patent [19]
Raza et al.

[11] Patent Number: 5,654,652
[45] Date of Patent: Aug. 5, 1997

[54] HIGH-SPEED RATIO CMOS LOGIC STRUCTURE WITH STATIC AND DYNAMIC PULLUPS AND/OR PULLDOWNS USING FEEDBACK

[75] Inventors: S. Babar Raza, Sunnyvale; Hagop Nazarian, San Jose, both of Calif.

[73] Assignee: Cypress Semiconductor Corporation, San Jose, Calif.

[21] Appl. No.: 534,358

[22] Filed: Sep. 27, 1995

[51] Int. Cl.$^6$ .................. H03K 19/017; H03K 19/0948
[52] U.S. Cl. .................. 327/17; 326/87; 326/121
[58] Field of Search .................. 326/112, 119, 326/121, 17, 87, 105–108

[56] References Cited

U.S. PATENT DOCUMENTS

| | | | |
|---|---|---|---|
| 4,360,902 | 11/1982 | Proebsting | 326/106 |
| 4,404,474 | 9/1983 | Dingwall | 326/106 |
| 4,641,046 | 2/1987 | Becker et al. | 326/119 |
| 4,645,952 | 2/1987 | Van Tran | 326/121 |
| 4,728,827 | 3/1988 | Woo | 326/17 |
| 5,001,367 | 3/1991 | Vinal | 326/121 |
| 5,015,890 | 5/1991 | Murakami et al. | 326/121 |
| 5,223,834 | 6/1993 | Wang et al. | 326/106 |
| 5,432,463 | 7/1995 | Wong et al. | 326/108 |

*Primary Examiner*—Edward P. Westin
*Assistant Examiner*—Jon Santamauro
*Attorney, Agent, or Firm*—Barnes, Kisselle, Raisch, Choate, Whittemore & Hulbert, P.C.

[57] ABSTRACT

A high speed ratio CMOS logic structure includes a static PMOS pullup transistor connected to an output node, and a plurality of NMOS pulldown transistors, connected in parallel, to the output node and which collectively define a pulldown circuit. The pullup transistor is biased using a reference voltage to define a static pullup strength for the logic structure. The pulldown strength of the pulldown circuit is also fixed. The combination of the pullup transistor, and the pulldown transistors define an N input NOR gate. The logic structure, however, further includes a feedback logic circuit, formed by a pair of inverters connected in series coupled to the output node to sense a current logic state of the output node. The feedback logic circuit generates an enable signal that is provided to a second, dynamic PMOS transistor connected in parallel with the static pullup PMOS transistor. When the logic state on the output node is low, the feedback logic circuit generates a low signal, which activates the dynamic PMOS transistor into a conductive state, thus increasing the pullup strength of the logic structure. This increased pullup strength provides for an improved switching for the next logic state transition: low-to-high. Once the output node has transitioned to the logic high state, and after a fixed time delay, the feedback logic circuit generates a logic high signal, which turns off the dynamic PMOS transistor, which weakens the pullup strength of the logic structure. In view of this weakened pullup strength, the next logic state transition of the output node—high-to-low—is accomplished much faster.

29 Claims, 3 Drawing Sheets

HIGH-SPEED RATIO CMOS LOGIC STRUCTURE WITH STATIC AND DYNAMIC PULLUPS AND/OR PULLDOWNS USING FEEDBACK

BACKGROUND OF THE INVENTION

1. Field of the Invention

The present invention relates generally to a high-speed ratio CMOS logic structure, and, more particularly, to such a logic structure that includes static and dynamic pullups/pulldowns employing feedback.

2. Description of the Related Art

A generalized understanding of CMOS logic structures may be had based on the assumption that p-channel, and n-channel MOS transistors act as simple switches. However, fundamental characteristics of such logic structures, such as the switching speed, the power dissipation, drive capability relative to subsequent stages and density restrictions have caused much investigation in the art as to the particular ways in which the MOS transistors deviate from the above-mentioned idealized viewpoint.

In particular, the above-mentioned drive requirement of a logic structure specifies that when an output of such structure should be a logic one, the output voltage should be as close to the positive power supply bus (e.g., $V_{DD}$) as possible. Likewise, when the output of such a logic structure should be a logic low, the output voltage should be lower than the threshold voltage $V_t$ of the next stage in order to obtain proper logic results. However, to obtain such a result, switching speed is often compromised. In particular, design of a logic structure that satisfies the minimum and maximum output voltages necessarily involves assessing the relative pullup "strength", and pulldown "strength" of the pullup and pulldown paths that are commonly used to form such logic structures.

The "strength" of a pullup or pulldown path is measured generally by its ability to sink or source current. Typically, the stronger a path, the more current it can source or sink. Further, it is well-known that the current through a MOS device (i.e., thus the relative "strength") is a function of the MOS transistor gain factor $\beta$, and the voltage applied to the gate terminal relative to the source terminal (i.e., $V_{gs}$). The transistor gain factor $\beta$ is further defined as a function of the process parameters, and device geometry. Thus, by manipulating $V_{gs}$, and $\beta$ (in particular, relative device geometries such as channel width and length), the relative strength of the pullup and pulldown paths can be adjusted to obtain predetermined design criteria.

Referring now to FIG. 1, one approach in the prior art in the design of CMOS logic structures is known as a classic design ratio logic structure, shown particularly as a design ratio NOR logic gate 10. Gate 10 includes a pullup circuit defining a pullup path 12 implemented by a p-channel MOS (PMOS) device 14, a pulldown circuit defining a pulldown path 16, implemented using a plurality of n-channel MOS (NMOS) devices $18_1, \ldots, 18_{n-1}, 18_n$, and output node 20. The relative strength of the pullup path 12 is defined, in part, by the reference voltage applied to the gate terminal of PMOS device 14. Further, for example, if the channel length of the PMOS device 14 (i.e., $L_p$), and the NMOS devices $18_i$ (i.e., $L_n$) are assumed to be equal (i.e., $L_p = L_n$), then the pullup strength of path 12, as well as the pulldown strength through pulldown path 16 may also be controlled by varying the ratio (i.e., thus the so-called ratio design) of the channel width of the PMOS devices 14 (i.e., $W_p$), and the channel width of the NMOS devices $18_i$ (i.e., $W_n$). Thus the pullup strength in the conventional design ratio NOR 10 may be defined by the magnitude of the reference voltage, and selection of particular device geometry. Likewise, the pulldown strength of circuit 16 may be defined as a function of the NMOS $18_i$ device geometry. In any event, both the pullup and pulldown "strengths" are fixed.

In operation, the inputs (input 1, ..., input n−1, input n) of NOR 10 may be connected to an output of a product term sense amplifier when NOR 10 is used in a programmable logic device (PLD). When any of the inputs, all of the inputs, or any combination of these inputs are high, the output DataOut on node 20 is driven low. Further, when all of the inputs are low, DataOut on output node 20 is driven high. This result is thus consistent with the logic NOR function.

To obtain these desired results, NOR gate 10 employs a ratio design between the referenced pullup device 14, and pulldown devices $18_i$. However, the ratio design, as discussed above, is constrained insofar as the pulldown strength must be sufficient to bring the potential on output node 20 to a level below threshold voltage $V_t$ of the next logic stage 22. It should also be apparent that if the pullup strength through pullup path 12 is too "strong", then one of the devices $18_i$ may have insufficient "strength" to pull the DataOut on output node 20 to a sufficiently low potential state and will cause a speed penalty for a high-to-low transition of DataOut. However, if the pullup strength is too weak as compared to the pulldown strength, then the low-to-high transition will be affected.

Thus, a major disadvantage of the conventional design ratio logic structure, as shown by a NOR gate 10 embodiment in FIG. 1, is that the pullup and pulldown device strengths in that approach are fixed. The fixed strengths limit the switching speed of such a logic structure by the relative magnitude of the selected pullup and pulldown strengths.

Accordingly, there is a need to provide an improved logic structure, suitable for use in programmable logic devices (PLDs) or Complex Programmable Logic Devices (CPLDs) that minimizes or eliminates one or more of the problems as set forth above.

SUMMARY OF THE INVENTION

It is an object of the present invention to provide a logic structure that addresses the limitation in the prior art relating to fixed pullup and/or pulldown strengths, especially with respect to switching speed. It is a further object of the present invention to provide a logic structure that is flexible in application, and that will not adversely affect the current logic state transition on a data output node. It is yet another object of the present invention to provide a logic structure particularly adapted for use in small programmable logic devices (PLDs), complex programmable logic devices (CPLDs) and Field Programmable Gate Arrays (FPGAs) for obtaining significant switching speed improvement.

To achieve these and other objects, and in accordance with the present invention, a logic structure having dynamic pullup and/or pulldown strengths is provided and which includes four major portions: a pullup circuit, a pulldown circuit, feedback logic, and means for adjusting at least one of the pullup strength and pulldown strength. In effect, the logic structure senses the current output logic state and dynamically adjusts the relative pullup and/or pulldown weighting in preparation for the next logic state transition of the logic structure.

The pullup circuit is provided for selectively forcing an output node of the logic structure to a first logic state, which is preferably a high potential, such as $V_{DD}$. The pulldown circuit is provided for selectively forcing the output node to a second logic state, preferably a low or ground potential $V_{SS}$. The composite or effective pullup and pulldown strengths of the logic structure include fixed contributions from the pullup circuit, and pulldown circuit, respectively.

The feedback logic is connected to the output node and is provided for generating an enable signal in accordance with the current logic state of the output node. The adjusting means is also coupled to the output node and selectively adjusts at least one of the pullup strength and the pulldown strength in accordance with the enable signal generated by the feedback logic. The adjustment to the pullup strength and/or pulldown strength prepares the output node for the next logic state transition wherein a switching speed to the next logic state is improved. That is, the preparation of the output involves increasing the relative pullup strength for a next low-to-high output node transition, and increasing the relative pulldown strength if the next logic state transition is high-to-low. Since it is the relative strength that is being dynamically adjusted, either the desired one of the pullup or pulldown strength can be increased, or, the pullup or pulldown strength other than the desired one can be decreased.

In a preferred embodiment, the adjusting means includes means for varying the pullup strength. In this embodiment, a second, pullup device defining a dynamic pullup path is selectively switched in parallel with the static pullup circuit and is activated by the enable signal. Thus, when the current logic state is a logic low, the enable signal is activated, thus causing the second pullup device to be also activated, thus increasing the effective, relative pullup strength of the logic structure. When the next logic state transition (i.e., from low-to-high) occurs, the increased pullup strength enables the potential associated with the output node to reach a logic high state in a shorter time interval, thus increasing switching speed. Likewise, once the output node has reached the logic high logic state, the enable signal is deactivated after some finite delay, thus also deactivating the second, dynamic pullup device, in effect, weakening the pullup strength of the logic structure. Accordingly, since the pullup strength has been lessened, the next transition (i.e., high-to-low) will occur more quickly due to a relative increase in the pulldown strength as a byproduct of decreasing pullup strength.

In another embodiment, a second, pulldown device defining a dynamic pulldown path is selectively activated in parallel with the static pulldown circuit to selectively adjust the pulldown strength as a function of the current state on the output node. In a still further embodiment, a dynamic pullup device, and a dynamic pulldown device are provided in combination with the conventional static pullup, and static pulldown device to provide yet further control in manipulating relative pullup/pulldown strength to improve switching speed.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 2:
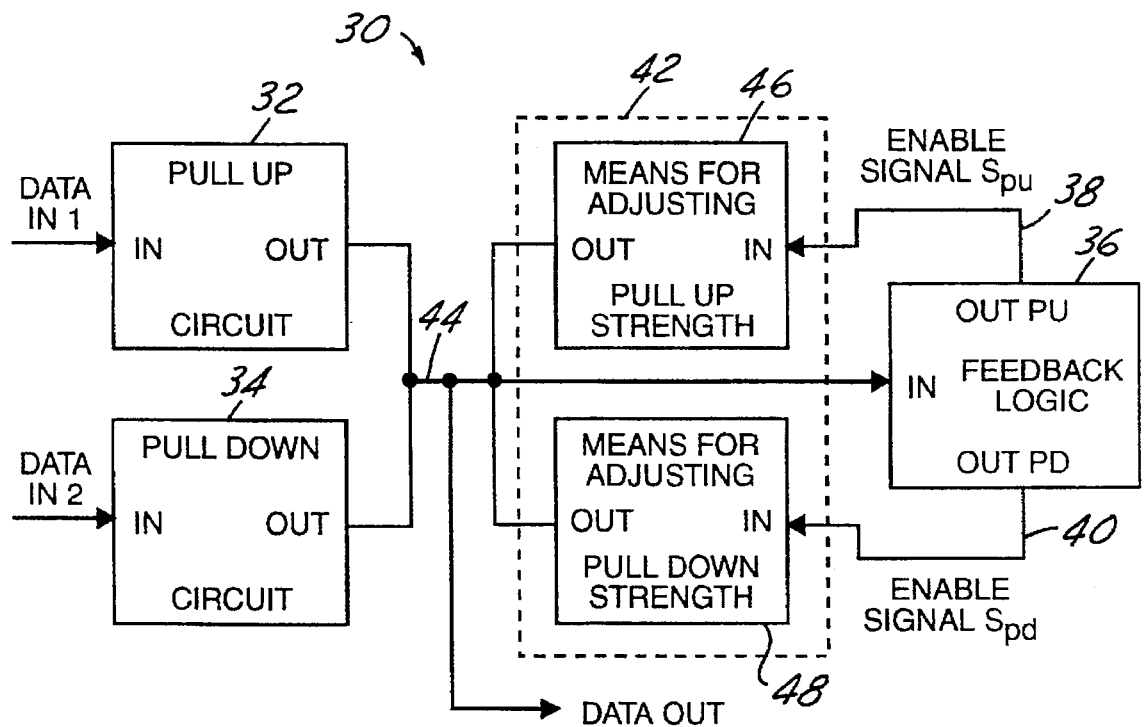
FIG. 2 is a simplified block diagram view of a preferred embodiment of the present invention illustrating, particularly, means for adjusting at least one of the pullup strength and pulldown strength.

Referring now to the drawings wherein like referenced numerals are used to identify identical components in the various views, FIG. 2 shows a logic structure 30 having dynamic pullup and pulldown strengths in accordance with the present invention. Logic structure 30 generally performs a logic function, with the input data being DataIn 1, and DataIn 2, and the output data being DataOut. Logic structure 30 includes pullup circuit 32, pulldown circuit 34, feedback logic 36, pullup enable signal $S_{pu}$ 38, pulldown enable signal $S_{pd}$ 40, means or circuit 42 for selectively adjusting at least one of the pullup strength and pulldown strength of logic structure 30, and output node 44. It should be understood that logic structure 30 includes appropriate connections to a positive power supply bus ($V_{CC}$ or $V_{DD}$) and negative power supply bus ($V_{SS}$), as is customary in the art, but which have been omitted for clarity.

Figure 1:
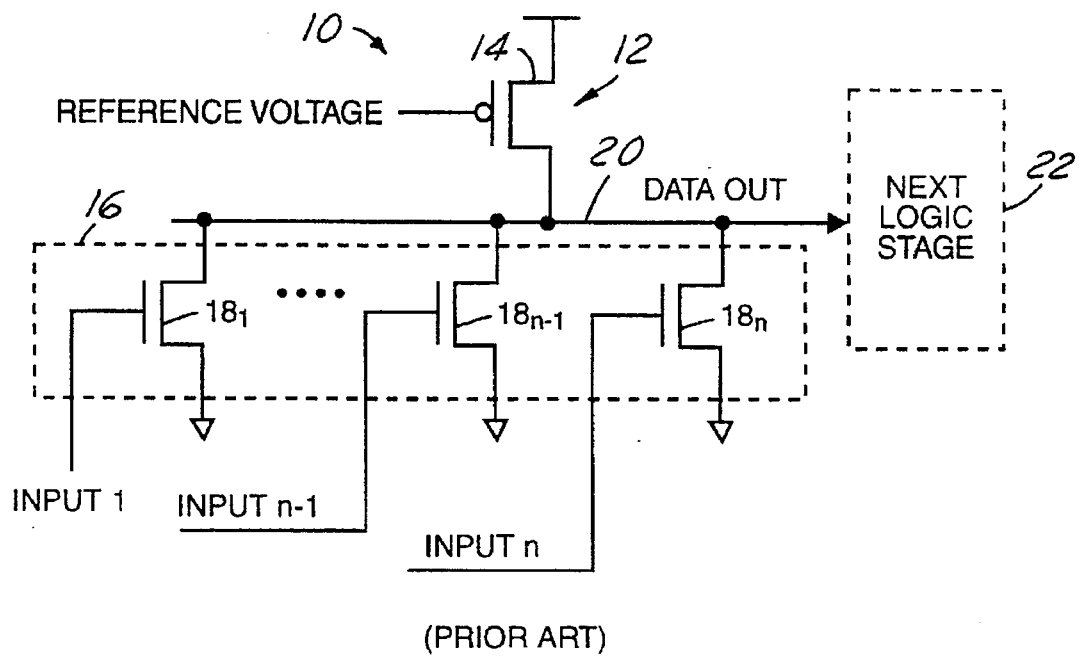
FIG. 1 is a simplified schematic and block diagram view of a conventional design ratioed NOR gate having fixed pullup and pulldown strengths.

Pulldown circuit 32 is responsive to DataIn 1 for selectively forcing output node 44 (DataOut) to a first logic state, preferably a positive power supply bus $V_{DD}$. As shown in conventional logic structures, such as NOR gate 10 of FIG. 1, DataIn 1 may be in the form of a reference voltage; however, depending upon the specific structure, the DataIn 1 provided to pullup circuit 32 may take the form of one or more discrete logic level inputs. The pullup strength of pullup circuit 32 is fixed.

Pulldown circuit 34 is responsive to DataIn 2 for selectively forcing output node 44 to a second logic state, preferably a negative power supply bus $V_{SS}$ at a ground potential. As with DataIn 1, DataIn 2 may take the form of an analog-type reference voltage, or, may be one or more discrete logic level inputs. The pulldown strength of pulldown circuit 34 is fixed.

Thus, the effective pullup and pulldown strengths of logic structure 30 includes the fixed contributions from pullup circuit 32, and pulldown circuit 34, respectively.

Feedback logic 36 includes an input coupled to output node 44 and is provided for generating pullup enable signal 38 ($S_{pu}$), and pulldown enable signal 40 ($S_{pd}$). Enable signals 38, and 40 are generated as a function of the current logic state assumed by output node 44, which is sensed by feedback logic 36. Enable signals 38, and 40 each include an activated, and deactivated state. Feedback circuit 36 further includes means for generating enable signals 38, and 40 in response to a transition of the logic state of output node 44 after a predetermined, finite time delay which may be substantially fixed.

Adjusting means 42 is coupled between feedback logic 36, and output node 44 and functions to adjust, selectively, and in accordance with enable signals 38, and 40, at least one of either the pullup strength (of logic structure 30) or the pulldown strength (of logic structure 30). In contrast to the relative strengths contributed by pullup circuit 32, and pulldown circuit 34, respectively, which are fixed or static, the pullup strength, and pulldown strength amounts contributed by adjusting means 42 vary dynamically. Furthermore, adjusting means 42, by dynamically adjusting relative pullup/pulldown strengths, prepares output node 44 for its next transition based on the current logic state of node 44 (by way of feedback logic 36). To perform this function, adjusting means 42 may include either or both means or circuit 46 for adjusting pullup strength, and means or circuit 48 for adjusting pulldown strength.

The present invention improves the performance of a logic structure dramatically by adjusting the relative strengths of the pullup and/or pulldown paths of structure 30 based on the current logic state of output node 44. In operation, the present invention illustrated in FIG. 2 operates as follows. Assume that DataIn 1, and DataIn 2 are applied to pullup circuit 32, and pulldown circuit 34, respectively, such that the DataOut on output node 44 is a logic low. The low logic level on output node 44 is sensed by feedback logic 36. Feedback logic 361 after a predetermined, finite delay, activates the pullup enable signal 38, but deactivates the pulldown enable signal 40. It should be apparent that for those embodiments of the present invention omitting one of means 46 or 48, that the corresponding enable signal may also be omitted.

Since a main operating principle of the present invention is to increase output node switching speed by preparing the output node in preparation for the next transition to a different logic state, the feedback logic accordingly delays generation of the proper enable signals so as not to interfere with the performance of the logic structure in settling in to the current logic state. The activated pullup enable signal 38 (after the finite time delay), activates the means for adjusting the pullup strength to thereby increase the pullup strength (both in relative and absolute terms) of the logic structure 30 on output node 44 through a path defined in adjusting means 46 itself. Means 48 for adjusting pulldown strength is not activated at this time.

When DataIn 1 and DataIn 2 change such that a low-to-high transition begins to occur on output node 44, such transition is enhanced (i.e., switching speed increased) by the increased effective pullup strength of the logic structure 30 as a whole, primarily by the added pullup strength provided by pullup strength adjusting means 46. After the low-to-high transition, the high logic state is provided to feedback logic 36, which, after the finite time delay, deactivates pullup enable signal 38, and activates pulldown enable signal 40. As a consequence, means 46 for adjusting pullup strength is also deactivated, thus weakening the pullup strength of the logic structure 30. Moreover, means 48 for adjusting pulldown strength may also be activated (if present), thus increasing the effective pulldown strength of logic structure 30. It should be appreciated that use of both means 46 for adjusting pullup strength, and means 48 for adjusting pulldown strength is optional; use of either one (or both) of such means in any particular logic structure 30 remains within the true spirit and scope of the present invention. In total, then, the logic structure 30 has been reconfigured or optimized for the next logic state transition occurring on output node 44 (i.e., a high-to-low transition).

Figure 3:
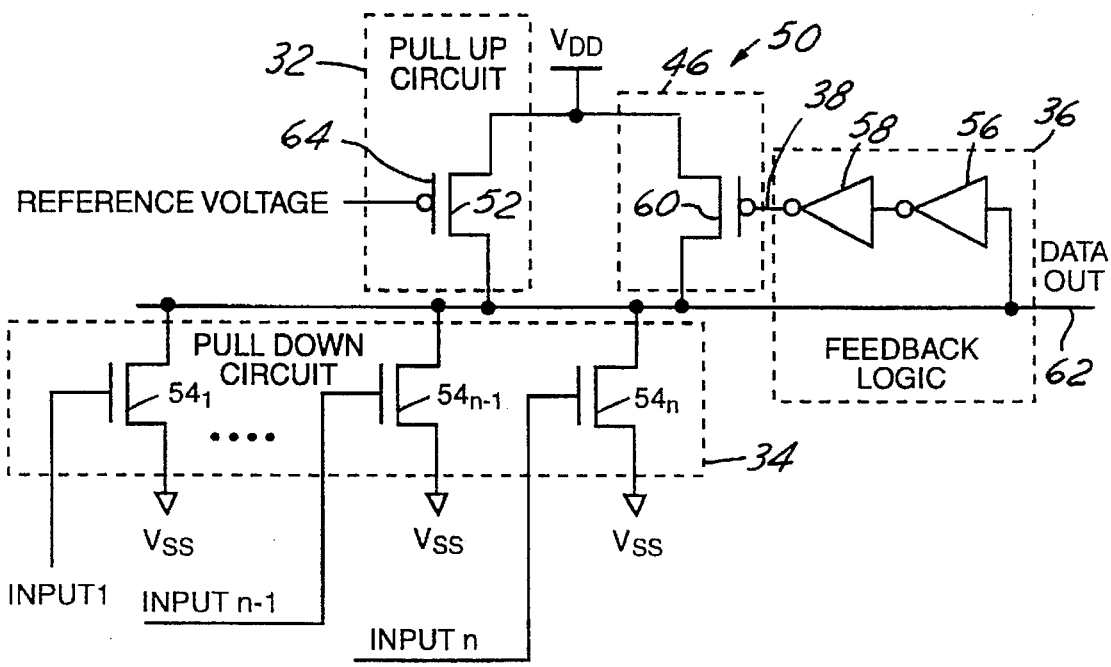
FIG. 3 is a simplified schematic and block diagram view of a NOR gate embodiment of the present invention, particularly including feedback logic for selectively activating a dynamic pullup device.

Referring now to FIG. 3, a NOR gate embodiment 50 of the present invention is depicted. In particular, NOR gate 50 is improved over conventional NOR gates, such as NOR gate 10, by embodying the principles of the present invention. Pullup circuit 32 includes a p-channel field effect transistor (FET) 52, pulldown circuit 34 includes a plurality of n-channel FETs $54_1, \ldots, 54_{n-1}, 54_n$, feedback logic 36 includes first inverter 56 and second inverter 58, and means 46 for adjusting pullup strength includes a second dynamic p-channel FET 60. NOR gate 50 includes an output node 62 for providing DataOut for the logic structure. It should be appreciated that other, particular components may be selected for use in an embodiment and still remain within the spirit and scope of the present invention. For example, an n-channel depletion-mode device may be used for the pullup or pulldown device, depending on the desired results. It should be apparent that if, for example, such a depletion-type device is used for pullup devices (both fixed and dynamic), then the feedback logic would also change (e.g., feedback logic changed to include one inverter to maintain the correct polarity).

DataIn 1 is comprised of a reference voltage applied to gate terminal 64 of p-channel FET 52. As discussed in the Background section, the reference voltage applied to FET 52 defines, in part, the fixed contribution to the pullup strength relative to output node 62.

DataIn 2 includes a plurality of discrete logic inputs (Input 1, Input n–1, ..., Input n). Thus, each gate terminal of n-channel FETs $54_1, \ldots, 54_{n-1}, 54_n$ define an input to NOR gate 50. The pulldown strength of each FET $54_i$ is fixed; however, the aggregate pulldown strength depends upon the number of activated FETs $54_i$.

Inverters 56, and 58 are connected in series wherein an input of inverter 56 is coupled to output node 62, while an output of inverter 58 defines the pullup enable signal 38. The propagation delay through the inverters 56 and 58 defines the time delay referred to above.

Figure 5A:
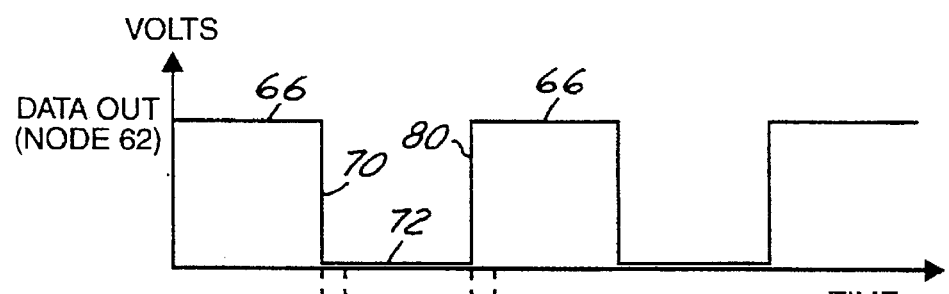
FIGS. 5A, and 5B are partial timing diagrams correlating activity on an output node of the NOR gate embodiment shown in FIG. 3 with the activity on the enable line of the same embodiment.
Figure 5B:
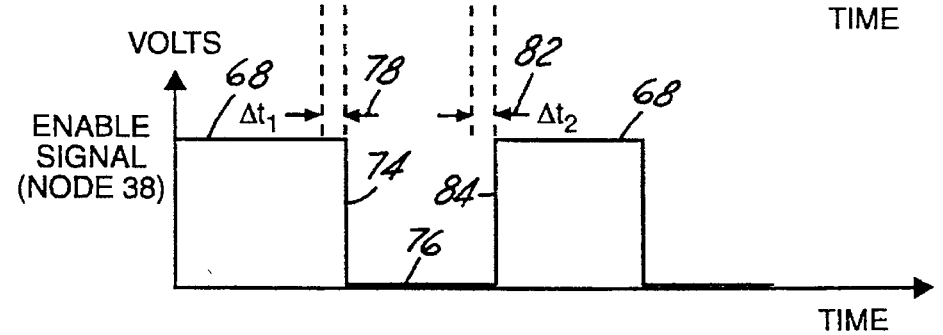

Referring now to FIGS. 3, and 5A–5B, NOR gate 50 only utilizes the dynamic pullup path implemented by way of adjusting means 46 to improve the switching performance of the logic structure (i.e., means 48 for adjusting pulldown strength is omitted). In operation, when all of the logic inputs (Input 1, ..., Input n–1, Input n) to pulldown circuit 34 are low, DataOut appearing on output node 62 assumes a first, high logic state, graphically depicted as logic state 66 in FIG. 5A. The high logic state 66 on output node 62 causes the pullup enable signal output of feedback logic 36 also to be high, and it thus assumes a logic high state 68, which in this embodiment is a deactivated state (FIG. 5B). The pullup enable signal 38 turns off PMOS FET 60, which causes the pullup strength of the NOR gate 50, relative to the output node 62, to be weaker, hence preparing it for a high-to-low transition 70, shown in FIG. 5A.

When any of the inputs (Input 1, ..., Input n–1, input n) to pulldown circuit 34 go high, output node 62 is driven to a second low, logic state 72. This is shown in FIG. 5A. The pullup enable signal 38 generated by feedback logic 36 (in response to sensing transition 70) undergoes a corresponding high-to-low transition 74 after a time delay of $\Delta t_1$, as shown generally at 78 in FIG. 5B. Inverters 56 and 58 thus define means for delaying the transition of enable signal 38. The low logic state 76 of the enable signal 38 is operative to activate or turn-on p-channel FET 60, thus increasing the pullup strength on output node 62. The pullup strength is increased because more current sourcing capability is available to charge a capacitance of output node 62 to a logic high state. This activation prepares node 62 for the upcoming low-to-high transition 80. The delay $\Delta t_1$ of feedback logic 36 is long enough so that the transition 70 of output node 62 is complete before enable signal 38 is able to turn-on p-channel FET 60, which would disrupt transition 70.

When all of the inputs to pulldown circuit 34 again go low, the output node 62 transitions from low-to-high, as illustrated by transition 80 in FIG. 5A. Transition 80 is assisted by the additional pullup strength provided by p-channel FET 60. After a time delay $\Delta t_2$, shown generally at 82 in FIG. 5B, the pullup enable signal 38 undergoes a low-to-high transition 84 to a deactivated logic state 68. With pullup enable signal 38 deactivated, p-channel FET 60 is deactivated and in a generally non-conductive state, thus causing the pullup strength on output node 62 to be weaker. The feedback logic 36 is thus operative, by way of means 46 for adjusting pullup strength, to adjust the relative strengths of the pullup and pulldown paths to improve a switching speed of the next logic state transition of output node 62.

Figure 4:
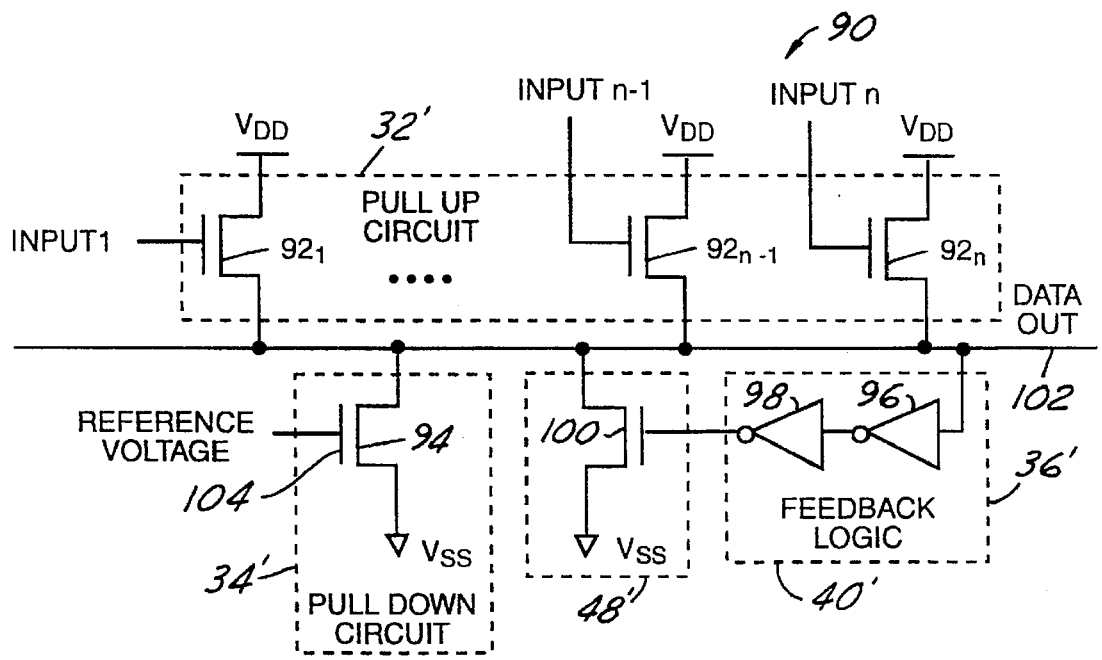
FIG. 4 is an OR gate embodiment of the present invention including particularly feedback logic for selectively activating a dynamic pulldown device.

Referring now to FIG. 4, an OR gate embodiment 90 of the present invention is illustrated. OR gate 90 operates in accordance with the embodiment of FIG. 2, and, in some ways, is similar to NOR gate 50 (e.g., such as feedback logic 36). In this embodiment, a pullup circuit 32' includes a plurality of n-channel FETs $92_1, \ldots, 92_{n-1}, 92_n$, pulldown circuit 34' includes n-channel FET 94, a feedback logic 36' includes inverters 96, and 98, and means 48' for adjusting pulldown strength includes n-channel FET 100. The logic state of output node 102 is defined in accordance with a logical OR function, as determined by the discrete logic inputs provided at Input 1 , . . . , Input n–1, Input n. The pulldown strength of pulldown circuit 34' is defined, in part, by a reference voltage applied to the gate terminal 104 of FET 94.

In operation, when all of the inputs (Input 1 , . . . , Input n–1, Input n) are low, output node 102 assumes a logic low state due to pulldown circuit 34'. Feedback logic 36', by way of inverters 96, and 98, generates a deactivated pulldown enable signal 40', after a finite, predetermined delay, which maintains n-channel FET 100 in a non-conductive state. This non-conductive state is desirable, since the next logic state transition on output node 102 will be a low-to-high transition through one or more n-channel FET $92_i$. With FET 100 off, more current will be available to charge a capacitance of output node 102.

When one or more of the n-channel FETs $92_i$ become conductive due to a high logic level on a corresponding input, the logic state on output node 102 will undergo a low-to-high transition. This low-to-high transition, as mentioned above, is enhanced by the fact that pulldown FET 100 is deactivated. However, after a time delay, feedback logic 36' generates an activated pulldown enable signal 40', thus placing n-channel FET 100 in a conductive state, which increases the pulldown strength on the output node 102 for the next transition: a high-to-low transition. That is, with FET 100 turned-on, an increased current sinking capability is available to discharge the output capacitance of output node 102. It should be apparent that by selectively adjusting the relative pullup and/or pulldown strength using feedback to alter the pullup and pulldown strengths, an improved switching speed from the current logic state to the next logic state is provided.

A logic structure in accordance with the present invention provides substantially improved output switching speed. In a constructed NOR gate embodiment, a switching speed improvement of approximately 400 ps was observed, compared to a nominal switching speed of about 1.0 ns for a conventional design ratio NOR gate. The invention is flexible in application, and may be employed in small PLDs, as well as CPLDs to obtain significant speed improvements.

While the invention has been particularly shown and described with reference to the preferred embodiments thereof, it is well understood by those skilled in the art that various changes and modifications can be made in the invention without departing from the spirit and scope of the invention, which is limited only by the appended claims.

We claim:

1. A logic structure having a pullup and pulldown strength, comprising:

a pullup circuit for selectively forcing an output node of said structure to a first logic state, said pullup circuit having a strength defined at least in part by (i) a first static reference current defined by a supply voltage and a first reference voltage other than said supply voltage and (ii) a first dynamic reference current defined by said supply voltage;

a pulldown circuit for selectively forcing said output node to a second logic state, said pulldown circuit having a strength defined at least in part by (i) a second static reference current defined by said supply voltage and a second reference voltage other than said supply voltage and (ii) a second dynamic reference current defined by said supply voltage, feedback logic coupled to said output node for generating an enable signal in accordance with a current one of said first and second logic states of said output node, wherein said enable signal controls the activation of said first and second dynamic reference currents such that up to one of said first and second dynamic reference currents are active at any given time; and, means coupled to said output node for selectively adjusting at least one of said dynamic reference currents according to said enable signal to prepare said output node for the next logic state transition wherein a switching speed to the next logic state is improved.

2. The logic structure of claim 1 wherein said pullup circuit includes at least one p-channel device, and said adjusting means comprises means for adjusting said first dynamic reference current comprising at least one p-channel device.

3. The logic structure of claim 1 wherein said pulldown circuit includes a plurality of n-channel devices.

4. The logic structure of claim 1 wherein said feedback circuit includes means for generating said enable signal in response to a transition to said current logic state after a time delay.

5. The logic structure of claim 4 wherein said generating means includes a pair of inverters connected in series wherein a propagation delay through said pair of inverter defines said time delay.

6. The logic structure of claim 1 wherein said adjusting means includes means for enabling or disabling said first dynamic reference current.

7. The logic structure of claim 6 wherein said varying means includes at least one p-channel device connected to said output node.

8. The logic structure of claim 6 wherein means for varying pullup strength includes a depletion mode device.

9. The logic structure of claim 1 wherein said adjusting means includes means for enabling or disabling said second dynamic reference current.

10. The logic structure of claim 9 wherein said varying means includes at least one n-channel device connected to said output node.

11. The logic structure of claim 1 wherein said pullup circuit includes a depletion mode device.

12. A logic gate having dynamic pullup strength relative to an output node of said gate, comprising:

a pullup circuit for selectively forcing said output node to a logic one state, said pullup circuit having a strength defined at least in part by (i) a first static reference current defined by a supply voltage and a first reference voltage other than said supply voltage and (ii) a first dynamic reference current defined by said supply voltage;

a pulldown circuit for selectively forcing said output node to a logic zero state, said pulldown circuit having a strength defined at least in part by (i) a second static reference current defined by said supply voltage and a second reference voltage other than said supply voltage and (ii) a second dynamic reference current defined by said supply voltage;

feedback logic coupled to said output node for generating an enable signal in accordance with a current logic state of said output node, said enable signal being activated when said current logic state is said logic zero state, wherein said enable signal controls the activation of said first and second dynamic reference currents such that up to one of said first and second dynamic currents are active at any given time; and, means coupled to said output node for selectively adjusting said pullup strength according to said enable signal, said adjusting means being operative for increasing said pullup strength when said enable signal is activated to thereby improve a first switching speed for a first transition of said output node from said logic zero state to said logic one state, said adjusting means being further operative for reducing said pullup strength when said enable signal is deactivated to thereby improve a second switching speed for a second transition of said output node from said logic one state to said logic zero state.

13. The logic gate of claim 12 wherein said pullup circuit includes a p-channel transistor having a gate terminal with a reference potential applied thereto to thereby define said fixed contribution to said pullup strength.

14. The logic gate of claim 12 wherein said pullup circuit includes a depletion mode device.

15. The logic gate of claim 12 wherein said pulldown circuit includes an n-channel transistor.

16. The logic gate of claim 15 wherein said pulldown circuit includes a plurality of n-channel transistors to define a logic NOR gate, each gate terminal of said plurality of n-channel transistors defining an input to said NOR gate.

17. The logic gate of claim 16 wherein at least one of said first and second dynamic reference currents is defined as a function of the number of activated n-channel transistors.

18. The logic gate of claim 17 wherein said fixed contribution to said pulldown strength is further defined as a function of a current carrying capability of said n-channel transistors.

19. The logic gate of claim 12 wherein said feedback logic includes an even number of inverters connected in series wherein an input of a first inverter is coupled to said output node and an output of a last inverter defines said enable signal.

20. The logic gate of claim 12 wherein said feedback logic includes means for delaying generation of said enable signal for a predetermined time interval.

21. The logic gate of claim 12 wherein said adjusting means includes a p-channel transistor having a gate terminal to which said enable signal is connected.

22. A logic gate having dynamic pulldown strength relative to an output node of said gate, comprising:

a pullup circuit for selectively forcing said output node to a logic one state, said pullup circuit having a strength defined at least in party by (i) a first static reference current defined by a supply voltage and a first reference voltage other than said supply voltage and (ii) a first dynamic reference current defined by said supply voltage;

a pulldown circuit for selectively forcing said output node to a logic zero state, said pulldown circuit having a strength defined at least in part by (i) a second static reference current defined by said supply voltage and a second reference voltage other than said supply voltage and (ii) a second dynamic reference current defined by said supply voltage;

feedback logic coupled to said output node for generating an enable signal in accordance with a current logic state of said output node, said enable signal being activated when said current logic state is said logic one state, wherein said enable signal controls the activation of said first and second dynamic reference currents such that up to one of aid first and second dynamic currents are active at any given time; and, means coupled to said output node for selectively adjusting said pulldown strength according to said enable signal, said adjusting means being operative for increasing said pulldown strength when said enable signal is activated to thereby improve a first switching speed for a first transition of said output node from said logic one state to said logic zero state, said adjusting means being further operative for reducing said pulldown strength when said enable signal is deactivated to thereby improve a second switching speed for a second transition of said output node from said logic zero state to said logic one state.

23. The logic gate of claim 22 wherein said pullup circuit includes a plurality of n-channel transistors to define a logic OR gate, each gate terminal of said plurality of n-channel transistors defining an input to said OR gate.

24. The logic gate of claim 23 wherein said fixed contribution to said pullup strength is defined as a function of the number of activated n-channel transistors.

25. The logic gate of claim 24 wherein said contribution to at least one of said first and second dynamic reference currents is further defined as a function of a current carrying capability of each one of said n-channel transistors.

26. The logic gate of claim 22 wherein said pulldown circuit includes an n-channel transistor having a gate terminal to which a reference voltage is applied to define said fixed contribution to said pulldown strength.

27. The logic gate of claim 22 wherein said feedback logic includes an even number of inverters connected in series wherein an input of a first inverter is coupled to said output node and an output of a last inverter defines said enable signal.

28. The logic gate of claim 22 wherein said feedback logic includes means for delaying generation of said enable signal for a predetermined time interval.

29. The logic gate of claim 22 wherein said adjusting means includes an n-channel transistor having a gate terminal to which said enable signal is connected.

* * * * *